Nov. 25, 1969 G. W. CARTER 3,480,873

GAIN CONTROL BIASING CIRCUITS FOR FIELD-EFFECT TRANSISTORS

Filed Dec. 11, 1967

INVENTOR
GEORGE W. CARTER
BY Eugene M. Whitacre
ATTORNEY

United States Patent Office
3,480,873
Patented Nov. 25, 1969

3,480,873
GAIN CONTROL BIASING CIRCUITS FOR FIELD-EFFECT TRANSISTORS

George W. Carter, Indianapolis, Ind., assignor to RCA Corporation, a corporation of Delaware Filed Dec. 11, 1967, Ser. No. 689,454
Int. Cl. H03g 3/30
U.S. Cl. 330—29 5 Claims

ABSTRACT OF THE DISCLOSURE

A dual gate field effect transistor amplifier circuit includes a source resistor which aids in establishing a relatively predictable operating point despite variations in the transistor characteristics. The gain of the amplifier circuit is controlled by an automatic gain control potential applied to the second gate electrode, and a porion of a gain controlling potential is applied to the first gate electrode to minimize voltage variations between the first gate electrode and the source electrode as the gain controlling potential changes.

This invention relates to automatic gain control bias circuits for field-effect transistors.

Multiple gate field-effect transistors, such as tetrode MOS transistors are field-effect transistors having two or more gate electrodes in addition to the source and drain electrodes. These devices have attractive characteristics for many circuit applications. Some of these characteristics are (1) high input impedance, (2) good cross-modulation performance, (3) low noise, (4) simplified direct coupling capability, and (5) compatibility with integrated circuit techniques.

It has been recognzed, in part due to the cross-modulation performance, that semiconductor circuit structure multiple gate field-effect transistors are well suited for automatic gain controlled high frequency amplifiers. One such use is disclosed in a patent application filed Nov. 3, 1966, in the names of Leonard Kaplan and O. Philip Hart, Ser. No. 591,821 and assigned to the Radio Corporation of America.

Since there is often a substantial variation in drain current from one field-effect transistor to the next for a given gate bias voltage, it is desirable to provide a resistor in series with the source electrode to provide DC degeneration and thereby reduce variation in drain current of production units. The provision of this resistor in the source electrode circuit, however, creates a stuation where the voltage between the gate electrodes and the source electrode vary as the current through the device changes.

It is an object of the present invenion to provide an improved auomatic gain controlled amplifier.

It is a further more specific object of the present invention to provide an improved automatic gain controlled multiple gate field-effect transistor amplifier which will maintain the first gate electrode to source electrode voltage relatively constant with changing device current.

An automatic gain conrol amplifier circuit embodying the present invention includes a multiple gate field-effect transistor having a source electrode, a drain electrode, and a plurality of gate electrodes. Input signals are applied to one of the plurality of gate electrodes and a gain controlling potential is applied to another one of the plurality of gate electrodes. A resistor interconnects the source electrode and a reference potential. Circuit means apply a portion of the gain controlling potential to the one gate electrode.

Figure 1:
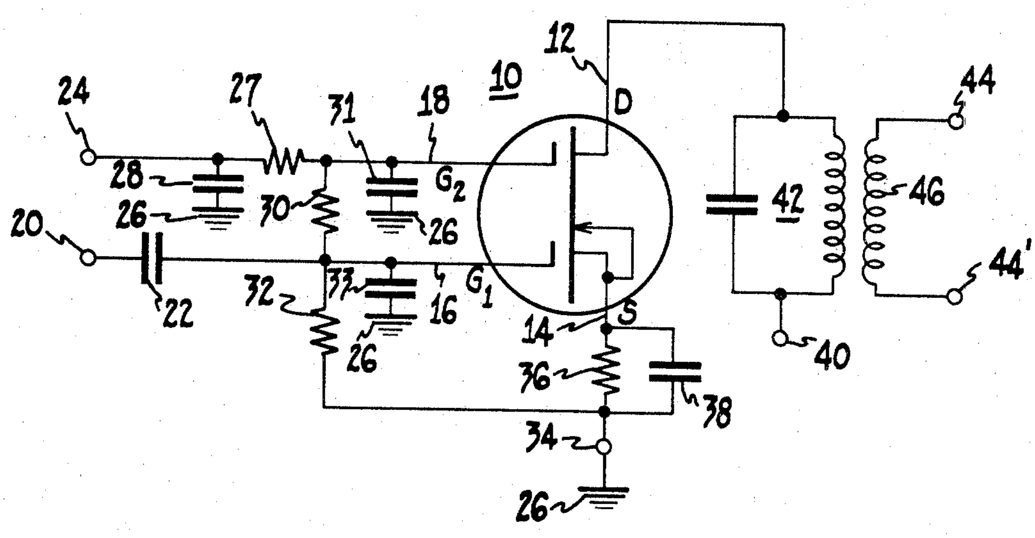
Figure 2:
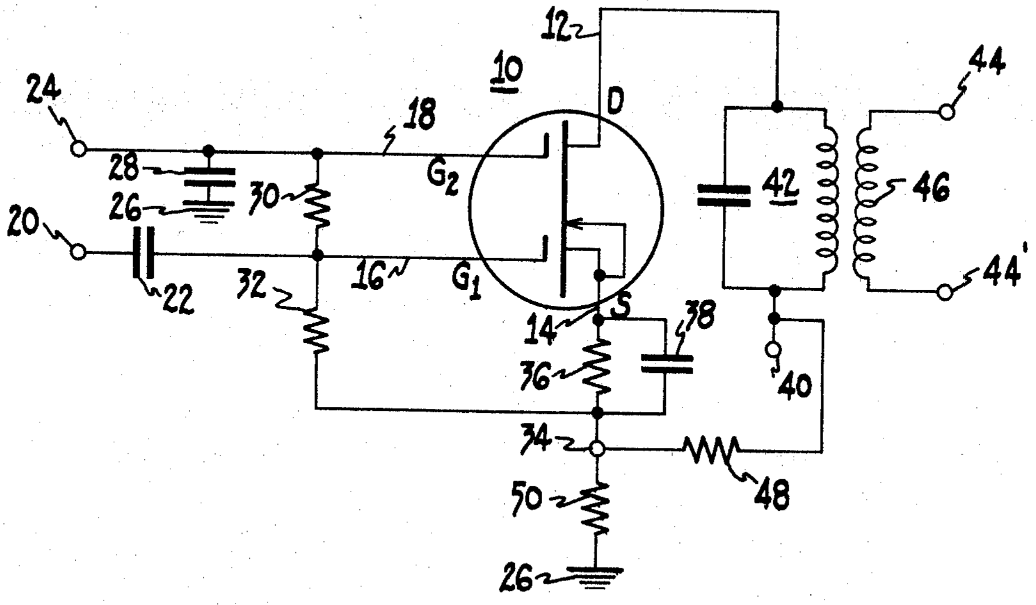

A complete understanding of the invention may be obtained from the following detailed description of a specific embodiment thereof, when taken in conjunction with the accompanying drawings, in which:

FIGURE 1 is a schematic circuit diagram of an automatic gain controlled tetrode field-effect transistor amplifier embodying the present invention; and FIGURE 2 is a schematic circuit diagram of the bias arrangement shown in FIGURE 1 modified to permit the use of a gain controlling potential of one polarity.

Reference is now made to FIGURE 1. A tetrode MOS field-effect transistor 10 having a drain electrode 12, a source electrode 14, a first gate electrode 16 and a second gate electrode 18 is connected as a high frequency automatic gain controlled amplifier. Input signals to the amplifier are applied at an input terminal 20 and passed through a DC blocking capacitor 22 to the first gate electrode 16. A gain controlling potential is applied to an automatic gain control input terminal 24 which is directly connected to the second gate electrode 18 by a decoupling resistor 27. High frequency signals appearing at the gain control terminal 24 are shorted to a ground 26 by a bypass capacitor 28.

The application of gain controlling voltages to the second gate electrode 18 as opposed to the first gate electrode 16 provides the advantages of an improved remote cut-off characteristic, and improved cross modulation performance. In addition, is available tetrode insulated gate field-effect transistors, the first gate electrode cannot withstand the normal range of gain controlling voltages required to achieve the necessary gain control range. However the second gate electrode has a thicker oxide insulating barrier and can handle the larger range of automatic gain controlling voltage.

Two resistors 30 and 32 are connected in series between the second gate electrode 18 and a terminal 34 which is connected to a reference potential shown as the ground 26. The junction of the serially connected resistors 30 and 32 is connected to the first gate electrode 16 to apply a portion of the gain controlling potential at the gain conrol terminal 24, to the first gate electrode 16. In this manner any voltage change at the gain control terminal 24 with respect to the ground will result in a change in voltage at the junction of the resistors 30–32 with respect to the ground and hence at the first gate electrode 16. Two capacitors 31 and 33 interconnect the second gate electrode 18 and the first gate electrode 16, respectively, with the ground 26. The capacitor 31 shorts high frequency signals appearing at the second gate electrode to the ground 26. Capacitor 33, in conjunction with other capacitances, aids in the tuning of an input resonant circuit, not shown, which is to be connected to the amplifier input terminal 20.

Because there is often substantial variation in the drain current from one field-effect transistor to the next, it is desirable to provide DC degeneration and thereby reduce variations in the drain current of production units. Thus, a resistor 36, which is bypassed at input signal frequencies by a capacitor 38, interconnects the source electrode 14 and the grounded terminal 34 to provide the desired DC degeneration. The inclusion of the resistor 36, however, causes the voltage at the source electrode to vary as the drain current changes. That is, the $I_DR_{36}$ voltage drop varies as the drain current $I_D$ changes in response to changes in the AGC potential.

If the serially connected resistor 30 was omitted, a change in the drain current caused by the change in the gain controlling potential applied at the terminal 24 would cause a change in voltage between the first gate electrode 16 and the source electrode 14. This change in the first gate electrode to source electrode voltage would move the operating point of the transistor 10, if left uncompensated.

A source of positive operating potential for the transistor 10 is provided by a power supply, not shown, connected to a terminal 40. A tuned circuit 42 connects the source of potential at the terminal 40 to the drain electrode 12. Output signals are developed between terminals 44 and 44' which are connected to an inductor 46, coupled to the L–C circuit 42.

Under the condition of maximum gain, a positive gain controlling potential is applied to the terminal 24. As the potential at the terminal 24 decreases (becomes less positive), the drain current $I_D$ also decreases with a resultant decrease in (less positive) voltage at the source electrode 14 ($I_DR_{36}$). This change in source potential tends to increase the voltage difference between the first gate electrode and the source electrode. However, because a portion of the change in the negative going gain controlling potential is applied to the first gate electrode 16 the change in voltage between the first gate electrode and the source electrode is minimized. In this manner, the bias arrangement tends to keep the first gate electrode to source electrode voltage constant as the automatic gain controlling potential varies, and hence, the operating point of the transistor 10 tends to remain constant as the automatic gain controlling potential applied to the second gate electrode 18 changes.

Reference is now made to the circuit shown in FIGURE 2 which is similar to that described above. The main difference in the circuit of FIGURE 2 is the addition of two resistors 48 and 50 which permit the use of a gain controlling potential of one polarity as is often desired.

The resistors 48 and 50 are serially connected between the source of operating potential at the terminal 40 and the ground 26. The junction of the resistors is connected to the terminal 34 and provides a positive reference voltage at that terminal. The entire circuit is thus raised above the ground potential to a desired level which will permit the use of a gain controlling potential of one polarity, which in the present instance is positive.

A particular set of values for the embodiments shown in the drawings which has provided satisfactory operation are set forth below. It will be appreciated that these values are by way of example only.

FIGURE 1

| | | |
|---|---|---|
| Transistor **10** | | RCA 3N140 |
| Capacitor **22** | picafarads | 27 |
| Capacitor **28** | do | 1,000 |
| Capacitor **31** | do | 1,000 |
| Capacitor **33** | do | 10 |
| Capacitor **38** | do | 1,000 |
| Resistor **27** | ohms | 100 |
| Resistor **30** | do | 820,000 |
| Resistor **32** | do | 270,000 |
| Resistor **36** | do | 270 |
| B+ (terminal **40**) | volts | +15 |

With the above values for the various circuit elements, an automatic gain controlling voltage, which can be a function of the strength of the amplifier input signal, ranging from +8 volts to −3 volts resulted in a 50db reduction in the gain of the amplifier.

EXAMPLE 2

| | | |
|---|---|---|
| Transistor **10** | | RCA 3N140 |
| Capacitor **22** | picafarads | 1,000 |
| Capacitor **28** | do | 1,000 |
| Capacitor **38** | do | 1,000 |
| Resistor **30** | ohms | 820,000 |
| Resistor **32** | do | 330,000 |
| Resistor **36** | do | 180 |
| Resistor **48** | do | 500 |
| Resistor **50** | do | 100 |
| B+ (terminal **40**) | volts | +18 |

It is to be understood that a P-channel semiconductor circuit structure could be utilized in place of the N-channel device shown, with corresponding changes in the polarity of the operating potential and bias potential source.

What is claimed is:

1. An amplifier circuit comprising:

a semiconductor device having a source electrode, a drain electrode, and a plurality of gate electrodes;

means for applying input signals to a first of said plurality of gate electrodes;

means for applying a gain controlling potential to a second of said plurality of gate electrodes;

a resistor connected to said source electrode such that changes in the gain controlling potential tend to change the current through said resistor and hence the voltage between said source and said first gate electrode, and circuit means for applying a portion of said gain controlling potential to said first one gate electrode.

2. An amplifier circuit as defined in claim 1 wherein said circuit means includes a resistor interconnecting said first and second gate electrodes.

3. An amplifier circuit as defined in claim 1 wherein said first gate electrode is physically closer to said source electrode than said second gate electrode.

4. An amplifier circuit as defined in claim 1 including means for establishing a reference potential connected to the remote end of said resistor connected to said source electrode so that said gain controlling potential is of one polarity throughout its range.

5. An amplifier circuit as defined in claim 1 wherein said circuit means maintains the voltage between said first gate electrode and said source electrode substantially constant when said gain controlling potential applied to said second gate electrode varies.

References Cited

UNITED STATES PATENTS 3,404,347 10/1968 Kaplan et al. ---------- 330—29

ROY LAKE, Primary Examiner

J. B. MULLINS, Assistant Examiner

U.S. Cl. X.R.

330—35, 38